United States Patent [19]

Turner

[11] Patent Number: 4,887,239

[45] Date of Patent: Dec. 12, 1989

[54] ONE-TIME PROGRAMMABLE DATA SECURITY SYSTEM FOR PROGRAMMABLE LOGIC DEVICE

[75] Inventor: John E. Turner, Beaverton, Oreg.

[73] Assignee: Lattice Semiconductor Corporation, Hillsboro, Oreg.

[21] Appl. No.: 882,602

[22] Filed: Jul. 7, 1986

Related U.S. Application Data

[63] Continuation-in-part of Ser. No. 707,666, Mar. 4, 1985.

[51] Int. Cl.[4] .................... G11C 11/34; G06F 11/00
[52] U.S. Cl. .................................. 365/185; 365/218; 364/200; 364/716
[58] Field of Search ............... 364/716, 200 MS File, 364/900 MS File; 340/825.83, 825.84; 365/96, 103, 104, 185, 189; 307/465, 468

[56] References Cited

U.S. PATENT DOCUMENTS

| 4,590,552 | 5/1986 | Guttag et al. | 364/200 |
| 4,609,986 | 9/1986 | Hartmann et al. | 364/200 |
| 4,617,479 | 10/1986 | Hartmann et al. | 307/465 |

Primary Examiner—Joseph A. Popek
Attorney, Agent, or Firm—Roberts and Quiogue

[57] ABSTRACT

A data security fuse system is disclosed for allowing one-time programmability of protected data cells in a reprogrammable logic device, which may determine, for example, the logic architecture of the device. The system includes a fuse enable circuit which may be erased to the disabled state only prior to packaging of the device during manufacture. The protected data cells may be selected for programming by a decoder which decodes cell selection signals. A security fuse circuit is enabled by a fuse enable signal from the activated fuse enable circuit. The security fuse circuit allows the protected cells to be selected once for programming after the system has been activated, and thereafter defeats any attempts to access the protected data cells.

16 Claims, 6 Drawing Sheets ance in the art to provide a programmable architecture security fuse circuit for a reconfigurable PLD which may be set after device fabrication, and thereafter allows the user to program the logic configuration a single time, thereafter
ONE-TIME PROGRAMMABLE DATA SECURITY SYSTEM FOR PROGRAMMABLE LOGIC DEVICE This application is a continuation-in-part of application Ser. No. 707,666, entitled "Programmable Data Security Circuit for Programmable Logic Device," filed Mar. 4, 1985.

BACKGROUND OF THE INVENTION

The present invention relates to programmable logic devices (PLDs), and more particularly to techniques for preventing the unauthorized modification of programmed data, such as data defining the architecture of PLDs.

PLDs provide a flexible logic architecture, userprogrammed through on-circuit fuses or switches, to perform specific functions for a given application. PLDs can be purchased "off the shelf" like standard logic gates, but can be custom tailored like gate arrays. The PLD typically includes thousands of the fuses or switches, arranged in one or more matrices known as AND or OR arrays to facilitate their manufacture and programming. To use conventional PLDs, system designers typically draft equations describing how the hardware is to perform, and enter the equations into a PLD programming machine. The unprogrammed PLDs are inserted into the machine, which interprets the equations and provides appropriate signals to the device to blow the appropriate fuses or set the appropriate switches such that the PLD will perform the desired logic function in the user's system.

It is known to employ security fuse circuits in bipolar PLDs and MOS EPROM PLDs to prevent interrogation of the data programmed into the device AND array. Bipolar devices employ fused links as the switch elements, and may not be erased once blown. The cells of PLDs using cells erasable by UV light may be erased, but this also erases the security fuse.

A PLD employing electrically erasable cells which is capable of being configured (and reconfigured) to a plurality of specific logic devices by means of programmable array and architecture data is described in pending application, Ser. No. 707,662, entitled Improved Programmable Logic Device" and having a common assignee with the present invention. Thus, the device can take the place of many other PLDs as a result of its versatility.

The referenced patent application entitled "Programmable Data Security Circuit for Programmable Logic Device," describes a security circuit which allows the device manufacturer of a reprogrammable logic device, e.g., one employing electrically erasable cells, to program the device to a particular logic architecture, and which thereafter prevents the user from modifying the protected data, which may be the architectural data and hence prevents the user from reconfiguring the device architecture. For some applications, it would be desirable to provide a reprogrammable PLD with a security device allowing the user to program the device architecture a single time if the security fuse has been set by the manufacturer or to repeatedly reconfigure the device architecture or other protected data if the fuse has not been set by the manufacturer.

It would therefore represent an advance in the art to provide a programmable architecture security fuse circuit for a reconfigurable PLD which may be set after device fabrication, and thereafter allows the user to program the logic configuration a single time, thereafter defeating any further attempts to modify the device architecture.

It would further be advantageous to provide a one time programmable architecture data security circuit for a PLD which allows the user of the PLD to program the architecture data, but thereafter defeats any attempts to alter the protected data, if the security circuit has been enabled during device fabrication, and otherwise allows the user to repeatedly reprogram the data.

SUMMARY OF THE INVENTION

The foregoing and other advantages and features are provided by the invention in a programmable logic device comprising a predetermined set of electrically erasable memory cells. A security fuse system is provided in the programmable logic device for allowing one-time programming of the set of memory cells. The system comprises an enable circuit responsive to a security fuse activation signal to provide a fuse enable signal. A decoder circuit is coupled to the set of memory cells for selecting the cells for programming in response to cell selection signals. The system further includes a security fuse circuit responsive to the fuse enable signal and to the cell selection signals. The fuse circuit is coupled to the decoder circuit for allowing one-time programming of the set of cells after the fuse enable circuit has been set, or enabled, and thereafter disables the decoder cell selection function to prevent subsequent selection of the cells for programming.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

The present invention comprises a novel security fuse system for programmable logic devices. In the following description numerous specific details are set forth, such as logic circuit and device block diagrams and the like, in order to provide a thorough understanding of the invention. It will be obvious to those skilled in the art that the invention may be practiced without these specific details. In other instances, well-known circuit and device details are not described in detail so as not to obscure the invention.

Figure 1A:
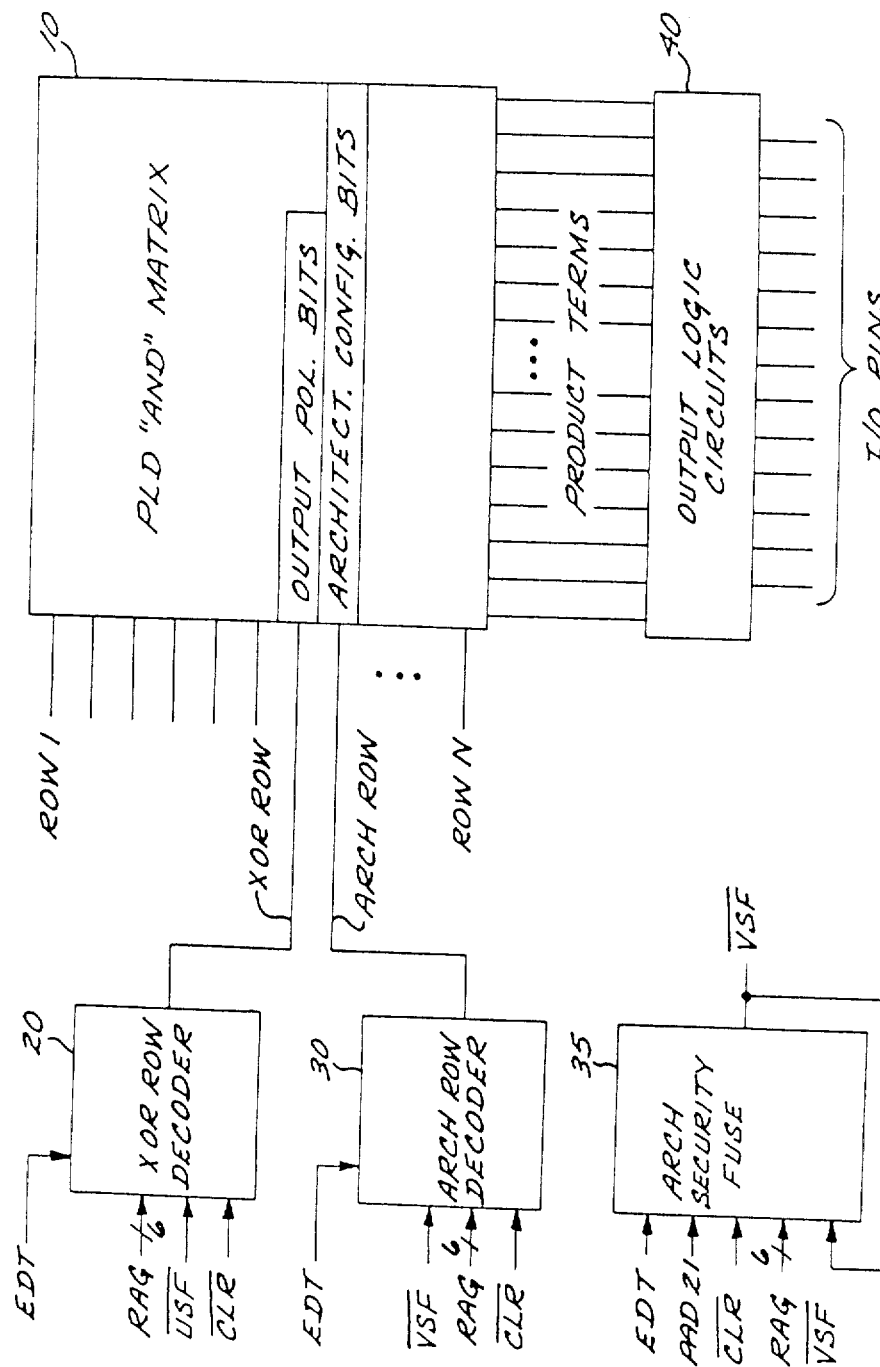
FIG. 1A is a block diagram illustrative of a programmable logic device incorporating the architecture security fuse of the present invention.

FIG. 1A is a partial block diagram of a PLD incorporating the security fuse circuit in accordance with the present invention. While the disclosed embodiment is for protecting programmable data defining the logic architecture of a PLD, it will be appreciated that the invention may be employed generally to protect programmed data of any type in a PLD employing reprogrammable data cells against alteration.

The PLD depicted in FIG. 1A is fabricated with a complementary metal-oxide-semiconductor (CMOS) technology and assembled in a multi-lead protective package. The PLD comprises AND matrix 10, comprising a large number of electrically programmable cells, arranged in rows and columns. The columns may form (with output inverters which are not shown) a product term, comprising the logical AND combinations of those row input line signals which are coupled to the product term. With a cell disposed at the intersection of each row input lines and each column or product terms, the cells provide the capability of selectively coupling a respective row input line to a corresponding product term. Output logic circuit 40 couples the product terms to the device output pins to provide the device logical outputs. Thus, the user may, by programming the cells or bits of the user portion of array 10 determine which input signals contribute to the logical outputs of the device. To this general extent, the programmability of the AND array is conventional, as described, for example, in the "PAL ® Handbook," Monolithic Memories, Inc., 1983, Section One, pages 5-11.

For purposes of describing the disclosed embodiment, it may be assumed that the logic architecture of the exemplary PLD is determined by the status of the data bits stored in the architecture row and the "XOR" row of the array. The bits in the XOR row provide the capability of inverting the output lines of the PLD to provide either inverted or non-inverted logical outputs. Thus, for a PLD having eight output lines, eight bits in the XOR row determine whether an inverter in each output line is activated. In this embodiment, seventy-four data bits in the architecture row determine the architecture of the remaining output circuitry, i.e., defining the specific output logic paths and functions to which the output circuit 40 of the PLD is configured.

Figure 1B:
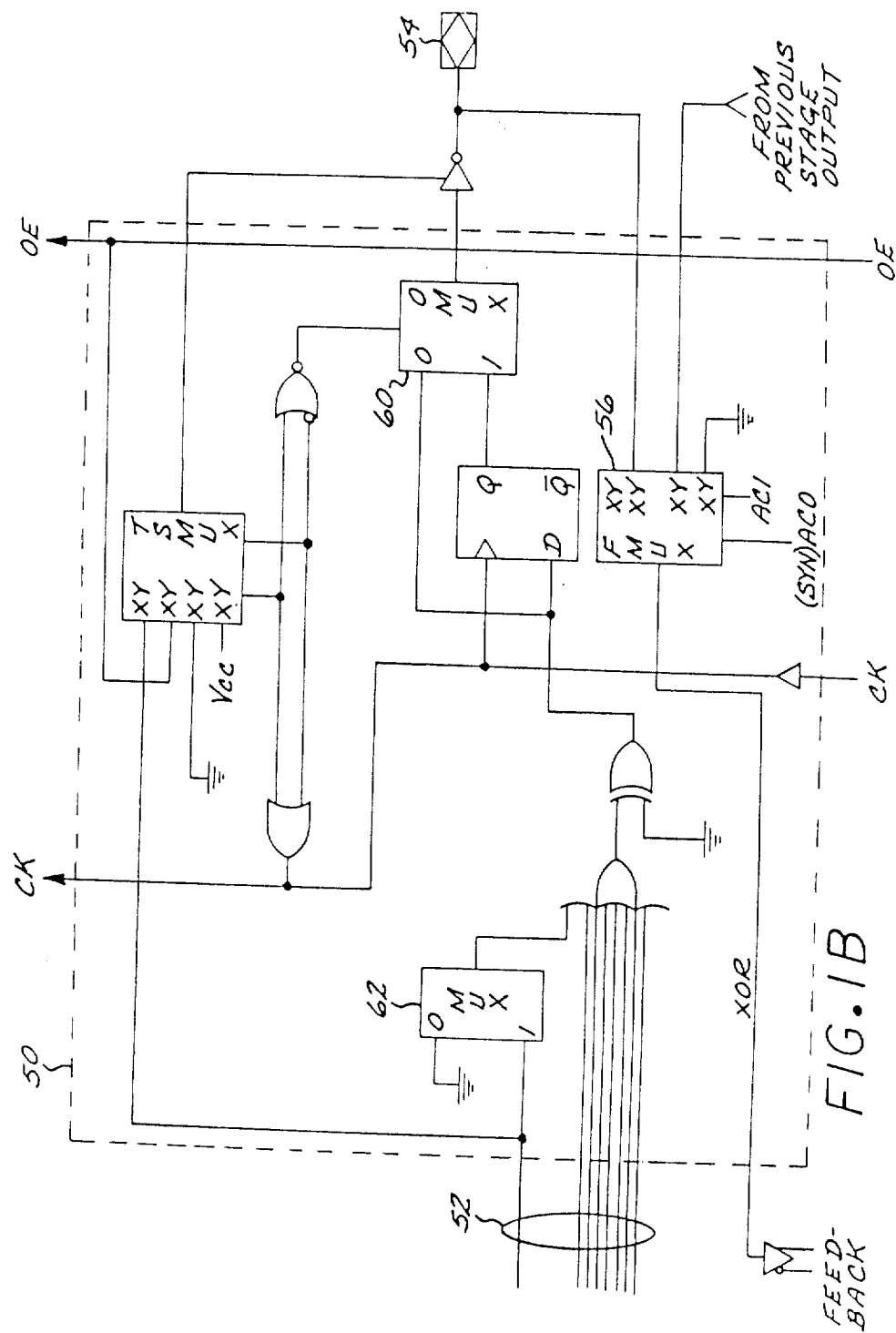
FIG. 1B is a schematic diagram of a typical output logic macrocell comprising the output logic circuit of the PLD of FIG. 1A.

By way of example, FIG. 1B is a simplified schematic of a typical output logic macrocell (OLMC) 50 comprising the output circuit 40. In this example, eight product terms are coupled to the cell 40, which is replicated eight times in circuit 40 to receive 64 product terms from the AND array 10. In the normal user mode, eight bit bus 52 couples the outputs of eight sense amplifiers associated with eight product terms to the OLMC 50. The OLMC 50 provides an output at pin 54, and allows the output signal to be individually set to active high or active low, with either combinational (asynchronous) or registered (synchronous) configurations. A common output enable (OE) can be connected to all synchronous device outputs, or a product term can be used to provide individual output enable controls for asynchronous outputs.

The various output circuit configurations of the PLD are controlled by programming bits within the architecture control word stored in the architecture row. Architecture control bit AC0 and the eight AC1 bits direct the outputs to be wired always on, always off (as an input), have a common $\overline{OE}$ term, or to be tri-state controlled separately from a product term. The architecture control bits also determine the source of the array feedback term through multiplexer 56, and select through multiplexer 60 either combinational or registered outputs. The SYN bit determines whether the PLD will have registered output capability or will have purely combinational outputs. The eight XOR bits determine individually each device output polarity. The OLMC operation will be apparent to those skilled in the art, and need not be described in additional detail.

The specific details as to the type and location of the data to be protected are exemplary, as the invention is not limited to protection of architecture data in a specific location in the PLD.

In the preferred embodiment, the PLD data cells of the matrix comprise electrically erasable floating gate transistors which may be programmed either into the depletion mode or enhancement mode, wherein the cell is respectively conductive or nonconductive during cell interrogation. The data cells further comprise a cell select transistor which is gated by an appropriate input line to select the particular cell. The memory cells of each row are programmable in a device "edit" mode by selecting the cells in a particular row and applying appropriate programming voltages to the gate, source and drain of the respective floating gate transistors of each cell to program particular ones of the floating gate transistors to the depletion mode (conductive when interrogated) in dependence on the status of programming data. Thus, only certain ones of the cells in a selected row are programmed to the conductive-when-interrogated state when the cells in the row are selected for programming; these particular ones are determined by the device user by specifying the programming data which in turn determines the levels of the voltages applied to the gate source and drain of the floating gate transistor during the programming mode. This sequence is repeated for each active row of the array 10 to program the array in the desired manner.

For this exemplary PLD, the device edit mode is selected by application of a super voltage (+20 volts) signal EDT to a predetermined pin of the device. This activates row decoders for each of the rows of the matrix 10, and otherwise reconfigures the device pin functions. In the edit mode, six of the device input pin signals define the six-bit word "RAG" (row address gate) which defines a particular row address. Thus, by way of example, row decoders 20 and 30 (FIG. 1) decode the particular RAG word selecting the XOR row and architecture row, respectively. The inputs to each of the row decoders comprise the "RAG" word and the $\overline{CLR}$ signal, which is activated by the user to clear or erase each of the user-accessible memory cell locations in the array. Another input to the XOR row decoder 20 is the $\overline{USF}$ signal, a signal generated by a user security fuse circuit which the device user activates to protect the user AND array cells and the XOR row from interrogation alteration.

Another input signal to the architecture row decoder 30 is the $\overline{VSF}$ signal, which is the output of the architecture security fuse 35 comprising the present invention.

The architecture security fuse 35 is provided to permit the device user to access the architecture row a single time in order to program the architecture configuration bits if the security fuse has been enabled during manufacture. If the security fuse has not been set by the manufacturer, the device user may program the architecture bits repeatedly. These architecture configuration bits determine the configuration of the output logic circuits 40 and their relationship to the AND matrix.

Thus, when the output $\overline{VSF}$ of the architecture security fuse 35 is active, the function of decoder 30 to select the architecture row for programming is disabled.

Figure 2:
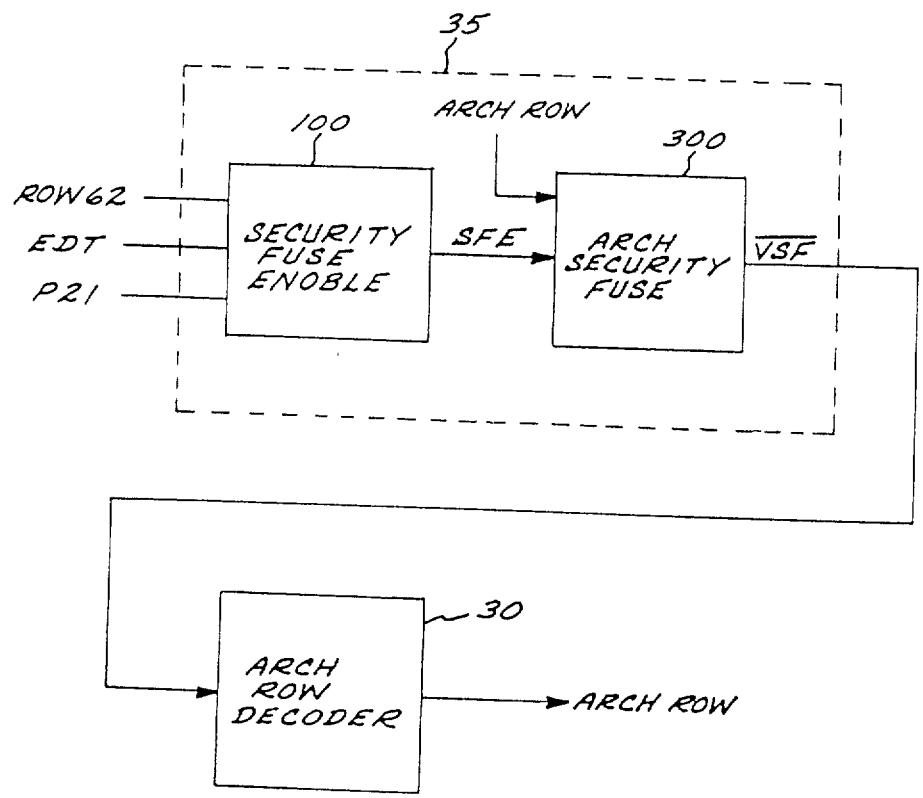
FIG. 2 is a block diagram of a one-time programmable security fuse system for protecting selected programmable cells in a PLD.

The one-time programmable security fuse system is illustrated in block diagram form in FIG. 2. This fuse system provides the capability of allowing the user to conduct a single programming cycle to program the protected cell locations if the system has been enabled during manufacture, and thereafter prevents the protected cells from being reprogrammed. However, their data contents can be read for verification of the architecture data. One advantage of this fuse circuit allowing one-time programming is that the manufacturer of a reprogrammable logic device could configure the device for one-time programming by the user, allowing the user to configure the part once to a desired logic configuration, thereafter locking the part to that configuration. The manufacturer also has the choice of setting or not setting the security fuse; if the fuse is not set, then the user may repeatedly change the programmed data determining the logic configuration.

In FIG. 2, security fuse 35 comprises security fuse enable circuit 100 and security fuse circuit 300. Security fuse enable circuit 100 enables the fuse circuit 300 by a security fuse enable signal SFE. The security fuse circuit 300 generates the security fuse signal $\overline{VSF}$ which is coupled to the decoder 30 for the protected cells, in this exemplary embodiment containing the architecture data.

Security Fuse Enable Circuit

Figure 3:
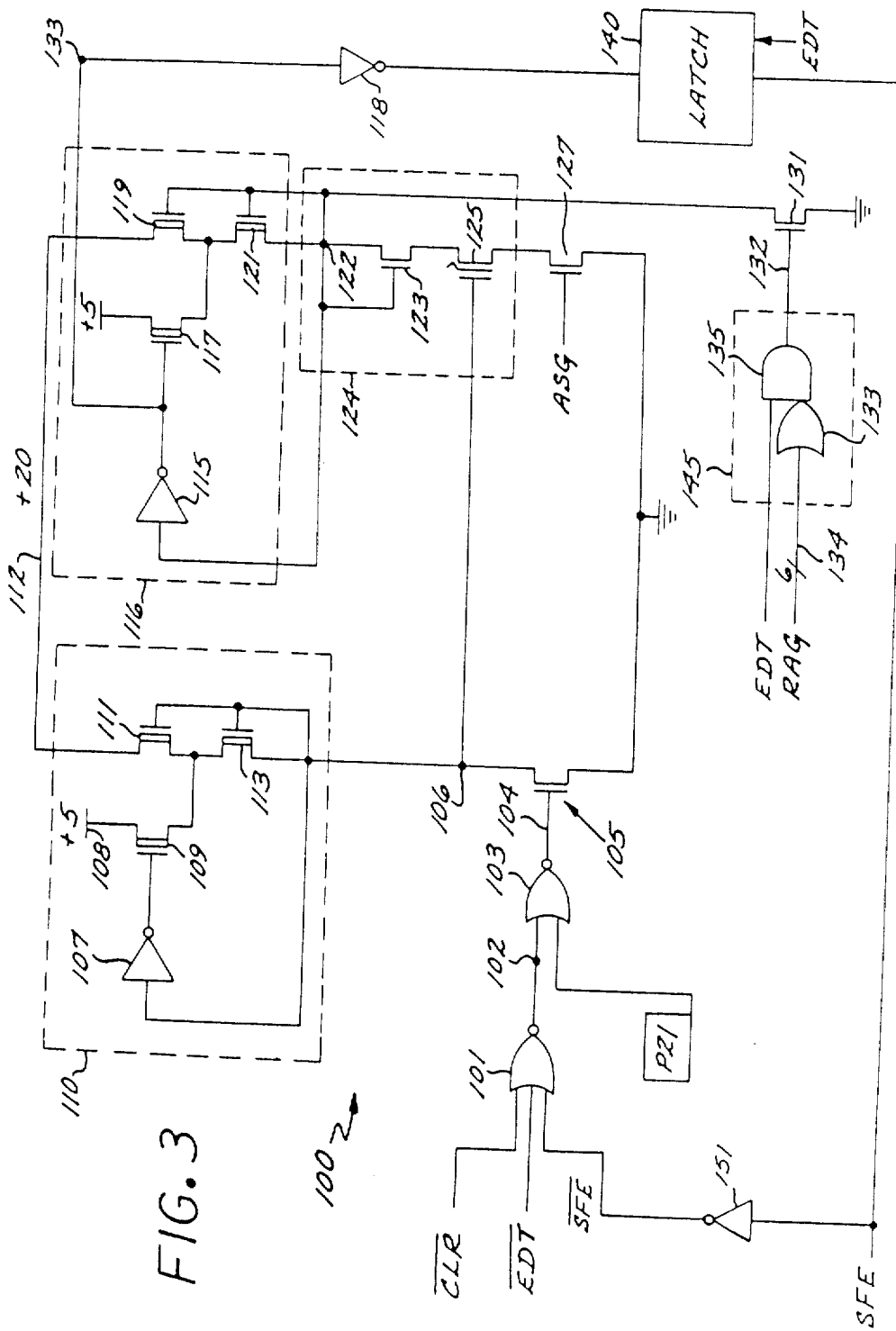
FIG. 3 is a schematic of the security fuse enable circuit comprising the system of FIG. 2.

An exemplary embodiment of the security fuse enable ("SFE") circuit 100 is illustrated in schematic form in FIG. 3. While the PLD is implemented in CMOS technology, the SFE circuit comprises depletion NMOS-type transistors 109, 111, 113, 117, 119 and 121, which are doped with arsenic so that the threshold turn-on gate voltage for these transistors is negative.

Transistors 109, 111, 113 and inverter 107 form a high impedance voltage pull-up circuit 110 which is coupled to node 106. Pull-up circuit 110 is adapted to pull node 106 up to the potential on node 112 (+20 volts) when transistor 105 is nonconductive, and to isolate the +20 volt supply from node 106 when node 106 is grounded, i.e., when transistor 105 is conductive. Transistors 117,119,121 and inverter 115 form a similar voltage pull-up circuit 116 which is coupled to node 122. If the node 122 is pulled low to ground, the pull-up circuit 116 is unable to pull the node potential above ground. Such pull-up circuits are known to those skilled in the art and need not be described in further detail.

Transistor 125 is the data storage element of the SFE circuit 100, and is a floating gate, N channel field effect transistor. The floating gate transistor is a well-known semiconductor device, and its characteristics are discussed, for example, in the book "Physics of Semiconductor Devices," by S. M. Sze, John Wiley & Sons, 1969, at Chapter 10. The floating gate transistor in the preferred embodiment is adapted to employ the well-known Fowler-Nordheim tunneling effect to configure the transistor in the enhancement or depletion mode. The floating gate is separated from the drain region comprising the transistor by a thin (100 Angstrom) oxide layer, so that in the presence of a sufficient electric field, charge will tunnel between the drain and the floating gate.

As will be described more fully below, when the floating gate transistor 125 is "erased," i.e., pro- grammed to the enhancement mode (nonconductive when interrogated), the security fuse enable circuit output SFE is HIGH, permitting the PLD architecture row data to be repeatedly programmed. When the floating gate transistor is programmed to the depletion mode (conductive when interrogated), however, the circuit 100 output SFE will be LOW to enable the security fuse circuit 300.

The inputs to NOR gate 101 are the $\overline{CLR}$ and $\overline{EDT}$ signals, and the signal $\overline{SFE}$, the output of inverter 151 of the SFE circuit 100. The output of NOR gate 101 will be HIGH only when all inputs to the gate are low. The output of NOR gate 101 at node 102 is coupled as one input to NOR gate 103. The other input to NOR gate 103 is node "P21." This node is buffered from a wafer probe pad which is accessible to wafer probe only prior to device die packaging.

As will be discussed below, node P21 provides an override function to force transistor 105 to the nonconductive state and cause node 106 to be pulled HIGH by pull-up circuit 110. This results from the operation of NOR gate 103, since if P21 is forced HIGH, the NOR gate output at node 104 will be LOW, irrespective of the state of the other gate input.

When node P21 is LOW, NOR gate 103 acts to invert the signal at node 102, the output of NOR gate 101. This effectively creates a logical OR function, so that with P21 low, the status of node 104 is the logical OR of $\overline{CLR}$, $\overline{EDT}$, and $\overline{SFE}$.

The output 104 of gate 103 is coupled to the gate of transistor 105, and when "HIGH" biases the transistor to the conductive state. Node 106, coupled to the gates of transistors 125, 113 in the pull-up circuit 110 will then be grounded.

If the output of gate 103 is LOW, transistor 105 will be nonconductive, node 106 is not clamped to ground, and the potential at node 106 is pulled up to +20 volts by circuit 110.

With the condition that transistor 105 is conductive, pull-up circuit 116 operates in a similar manner with respect to node 122 as described with respect to circuit 110 and node 106. However, there are two possible paths from node 122 to ground, the first path through transistors 123, 125, and 127, and the second path through transistor 131.

Transistor 123 is connected for diode operation, and is employed with transistor 125 to create an electrically erasable, programmable data storage cell 124. Interrogation of the status of memory cell 124 is performed by inverter 115, and occurs when node 106 is grounded (transistor 105 in the conductive state), transistor 127 is conductive (signal "ASG" applied to its gate is at +2.5 volts) and transistor 131 is nonconductive (with its gate at ground). The status of node 122 will depend on the state of memory cell 124. If the floating gate transistor 125 is erased, so that it is in the enhancement mode, transistor 125 will be nonconductive. Node 122 will be pulled HIGH by pull-up circuit 116, and the output of inverter 115, at node 133, will be LOW.

If, on the other hand, transistor 125 is programmed to the depletion mode, the transistor will be in the conductive state with its gate grounded. With transistor 127 also conducting, node 122 will be LOW. Under these conditions, the output of inverter 115 at node 133 will be HIGH.

Node 133 at the output of inverter 115 is coupled through inverter 118 to latch 140. The output of latch 140 is the SFE circuit output signal SFE, which is coupled in the inverted form $\overline{SFE}$ to the input of NOR gate 101 via inverter 151. Except when signal EDT is active, latch 140 is transparent to the state of node 133. When EDT goes HIGH the signal SFE is latched to the current state, and is not affected by subsequent changes in the state at node 133 while EDT is HIGH.

Security Fuse Circuit

Figure 4:
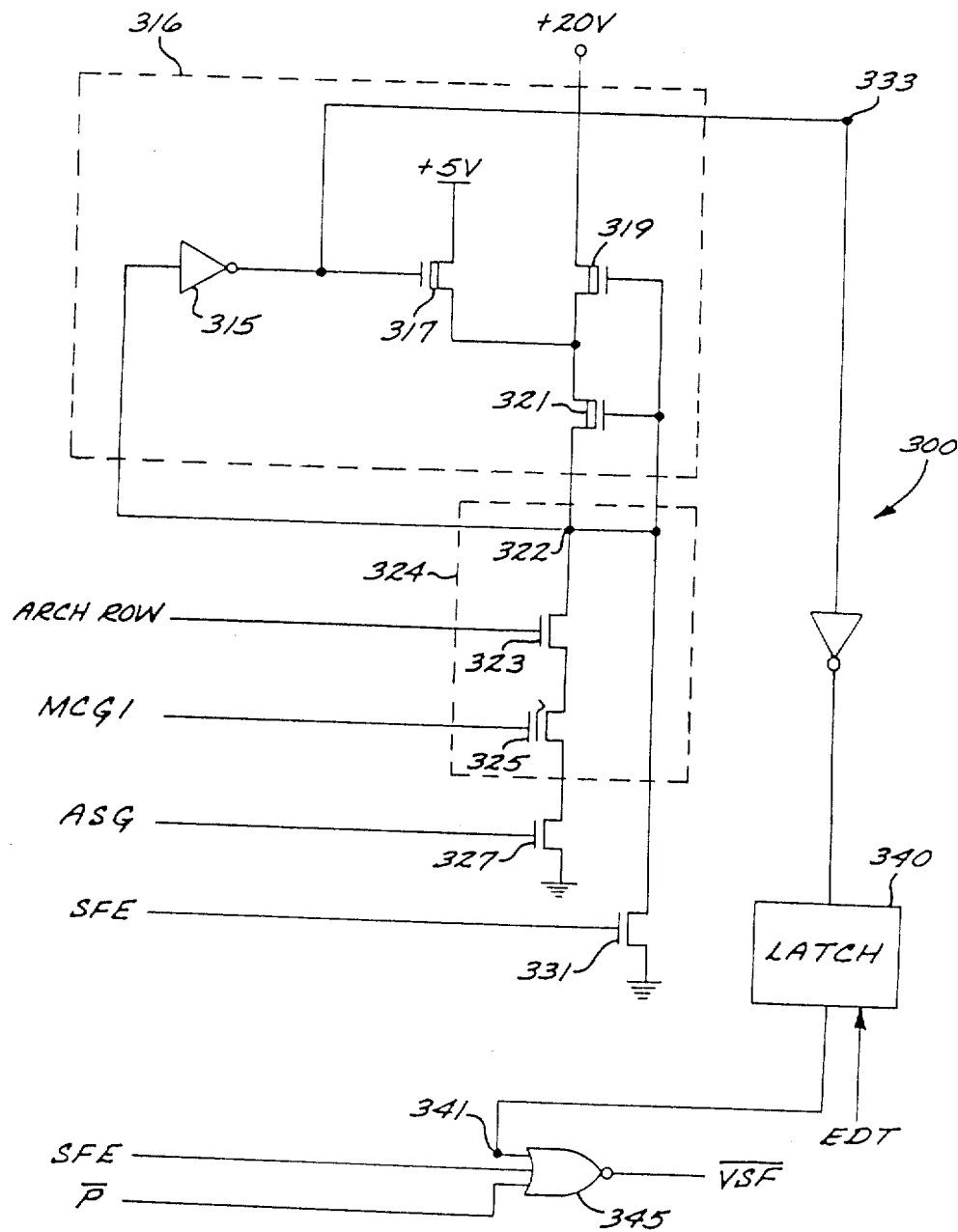
FIG. 4 is a schematic diagram of the security fuse circuit portion of the system of FIG. 2.

FIG. 4 is a schematic diagram of the security fuse circuit 300. The circuit 300 comprises electrically erasable cell 324, formed by floating gate N-channel transistor 325 and select transistor 323. Node 322 of cell 324 is coupled to ground through transistor 331, which is gated by the signal SFE. The circuit 300 further comprises a high voltage pull-up circuit 316, including transistors 317, 319 and 321, and inverter 315, which operates in a similar fashion to circuit 116 of FIG. 3.

The output of inverter 315 on node 333 is coupled to latch 340, and the latched signal is provided as one input to NOR gate 345. The signals SFE and $\overline{P}$ (active except in the device edit mode) are also provided as inputs to gate 345.

The security fuse circuit output signal is the output $\overline{VSF}$ from the NOR gate 345.

Cell 324 illustrates a general cell configuration which may be replicated throughout the array 10 to form the programmable connections of the array.

The circuit 300 operates in the following manner. The cell 324 is selected by a HIGH signal on the gate of the select transistor 323, i.e., the condition that the signal ARCH ROW is at the HIGH logic level. The transistor 325 is interrogated by the signal MCG1, nominally +2.5 volts, applied to its gate. Thus, when the cell 323 is "selected," and transistor 325 is interrogated, transistor 323 is conductive. Transistor 325 will be conductive if programmed to the depletion mode, and nonconductive if erased to the enhancement mode.

During the device normal user mode, the signal ASG will be at the nominal +2.5 volt level, gating the transistor 327 to the conductive state. The potential at node 322 will then depend on the state of transistor 325. If it is conductive, node 322 will be coupled to ground, and the sensed output of the cell at node 333 will be HIGH. If transistor 325 is not conductive node 322 will be pulled HIGH by the pull-up circuit 316, and the sensed output of the cell 324 at node 333 will be LOW.

The cell 324 is selected for programming at the same time the architecture row is selected Thus, the signal ARCH ROW goes HIGH, driving the select transistor 323 to the conductive state. The MCG1 signal at the gate of floating gate transistor 325 is brought to ground. Signal ASG is also brought to ground, gating transistor 327 to the nonconductive state.

With these conditions, the potential at node 322 will remain at ground so long as the signal SFE is HIGH, gating transistor 331 to the conductive state. This will prevent the transistor 325 from being programmed to the depletion mode.

When the SFE circuit is enabled by programming the SFE bit, the signal SFE goes LOW, turning off transistor 331. This allows the transistor 325 to be programmed to the depletion mode the next time the architecture row is selected for programming. Now, with select transistor 323 pulled HIGH to +20 volts, transistors 327 and 331 turned off, and the signal MCG1 grounded, the potential at 322 will rise due to the pull-up action of transistors 319, 321. Inverter 315 will flip LOW as the potential at node 122 rises, turning off transistor 317 so that node 322 rise to +20 volts. With the gate of transistor 325 grounded and the drain at +20 volts less the enhancement threshold voltage of transistor 323, or about 18 volts, electrons will tunnel off the floating gate to the drain, programming the transistor 325 to the depletion mode. In this mode, cell 324 will conduct when interrogated by the signal MCG1 at 2.5 volts and when sensed by inverter 315, coupling node 322 to ground. With its input at ground, the inverter output goes HIGH.

Security Fuse Row Decoder

Figure 5:
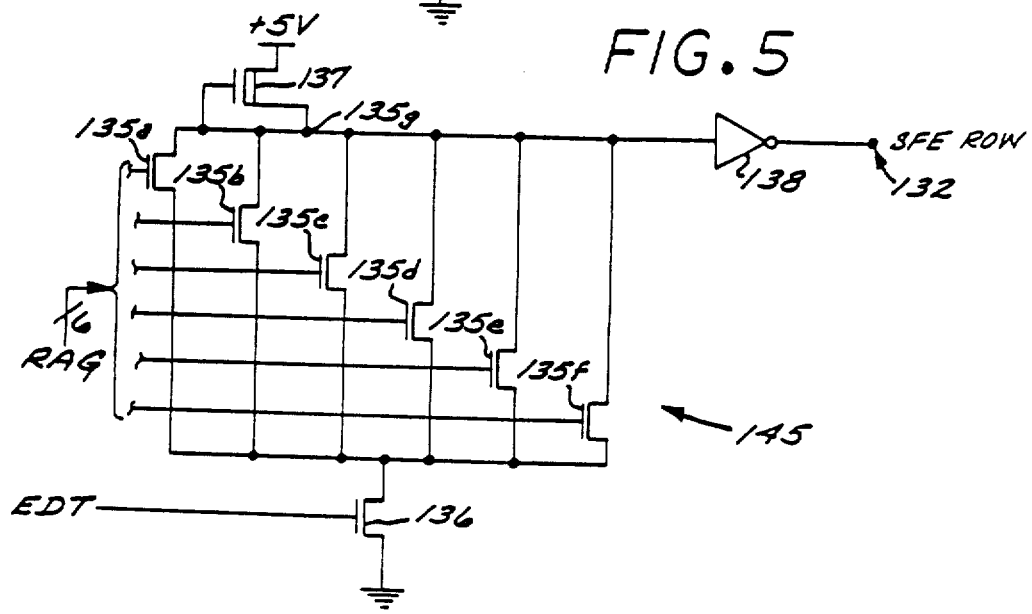

The row decoder 145 for selecting the security fuse enable function is shown in schematic form in FIG. 5. The decoder basically performs a OR decode function (represented schematically by OR AND complex gate 133 in FIG. 3) on the RAG row selection signals. Depletion transistor 137 performs a voltage pull-up function on node 135g when the node is not clamped to ground through transistor 136 and any of transistors 135a-f. Inverter 138 inverts the state of node 135g, and node 132 is connected to the gate of transistor 131 (FIG. 3). Thus, when the SFE row is selected, each of transistors 135a-f is turned off, transistor 137 pulls up the voltage on node 135g, and node 132 goes LOW, turning off transistor 131. When the SFE row is not selected and when EDT is HIGH, node 135g is clamped to ground, node 132 goes HIGH, and transistor 131 is turned on.

Architecture Row Decoder

Figure 6:
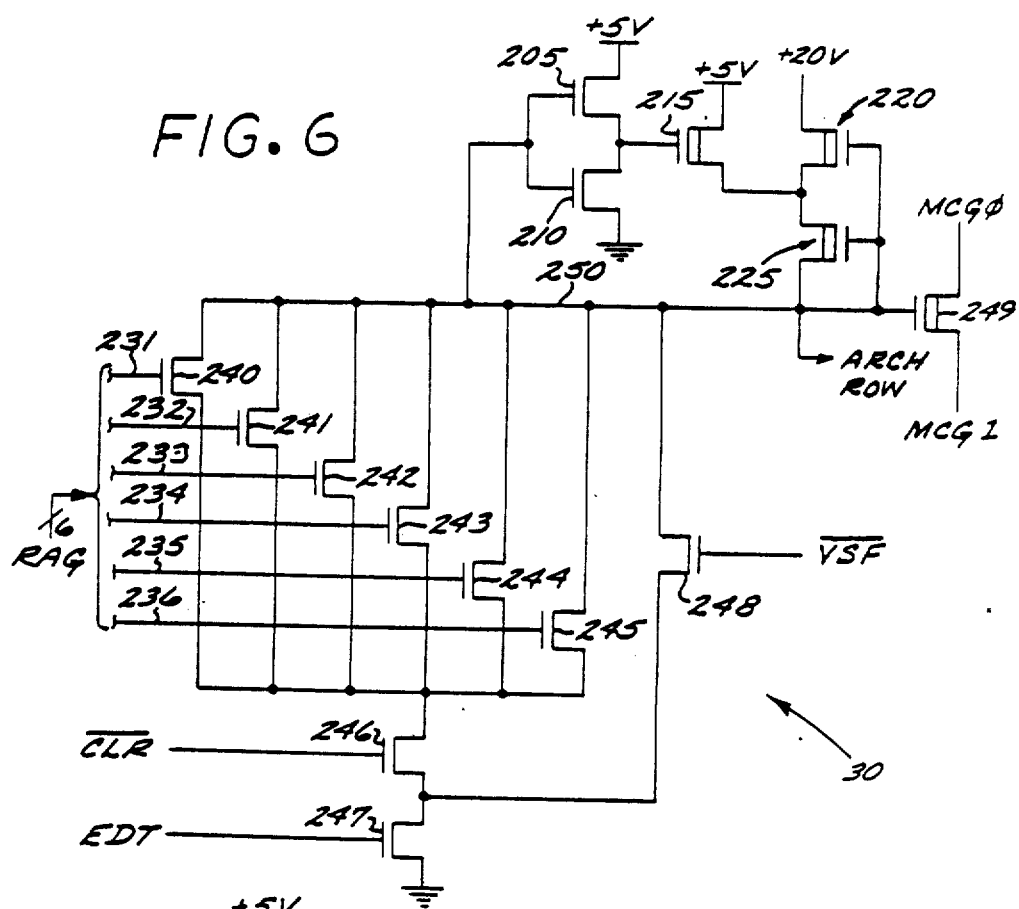
FIGS. 5 and 6 are schematic drawings of two row decoder logic circuits employed in the preferred embodiment.

FIG. 6 is a schematic drawing of architecture row decoder 30. This decoder decodes the row address gate (RAG) row selection signals to select the row containing the protected information, in this embodiment the logic architecture data. Generally, a row is selected for programming or verification of the data residing in the memory cells of a particular row. The decoder 30 essentially performs a NOR function on the RAG word and EDT signals. The transistors 205, 210 and depletion transistors 215, 220, 225 form a high impedance, high voltage pull-up circuit. When no path to ground from node 250 exists, the voltage pull-up circuits pull the voltage at node 250 up to a HIGH level.

In the device edit mode, the signal EDT is HIGH, turning on transistor 247. Except when performing a "bulk erase" cycle, $\overline{CLR}$ is LOW, turning off transistor 246 and driving node 250 to +20 volts independent of the RAG address. Each of transistors 240-245 will be turned off when the appropriate RAG word to select the architecture row is present, so that there is no path to ground from node 250 through transistors 240-245 in this condition, and unless transistor 248 is turned on, node 250 will be pulled HIGH.

Node 250 is the row decoder output and is coupled to each of the select transistors comprising the memory cells in the architecture row, thereby selecting each of the memory cells in that row for programming or verification. The high potential at node 250 also turns on transistor 249, which couples the MCG∅ signal to node MCG1, coupled to the gates of the floating transistor memory elements of the programmable cell matrix (for example, cells 324 of FIG. 4). The MCG∅ signal is at the appropriate voltage level (+2.5v) for interrogation of the user array cell states. Thus, a HIGH signal at node 250 serves to select the memory cells of the architecture row for erasure by allowing MCG1 to rise to +20 volts.

If $\overline{VSF}$ is low, i.e., the architecture security fuse is erased, then transistor 248 of decoder 30 is turned off, allowing node 250 to be pulled HIGH when selected. However, if the fuse is programmed, $\overline{VSF}$ is HIGH, turning on transistor 248. Node 250 is then clamped to ground through transistors 248 and 247, preventing the memory cells in the architecture row from being selected, irrespective of the status of the RAG word.

During the PLD bulk erase cycle, $\overline{CLR}$ goes low, turning off transistor 246. Then node 250 will be pulled HIGH, unless $\overline{VSF}$ is HIGH, irrespective of the state of the RAG word. However, the security fuse signal $\overline{VSF}$ will defeat the bulk erase cycle for the architecture row, i.e., if $\overline{VSF}$ is HIGH.

SFE Circuit Initialization

To initialize the state of the SFE circuit, node P21 is forced HIGH during the wafer probe stage of the PLD chip fabrication, from a probe pad which is not accessible once the wafer has been packaged. The output of NOR gate 103 is LOW unless both inputs are LOW. Hence, with one input (P21) to NOR gate 103 forced HIGH, its output will be LOW, driving the gate of transistor 105 LOW so that the transistor becomes non-conductive.

With transistor 105 non-conductive, node 106 is no longer clamped to ground, and as the potential on node 106 is pulled up as discussed above, the output of inverter 107 is flipped low, turning off transistor 109. Transistor 111 turns on, and with both transistors 111, 113 turned on, the voltage at node 106, coupled to the gate of transistor 125, rises to +20 volts.

Under these conditions, during the device edit mode, floating gate transistor 125 of cell 124 may be "erased" to the enhancement mode by turning on transistors 127 and 131. The ASG signal at the gate of transistor 127 is brought to 5 volts to turn on transistor 127. The EDT signal is HIGH during the edit mode; the security fuse row is not selected so that the gate of transistor 131 is brought HIGH, as discussed above, turning on transistor 131. With both the drain and source of transistor 125 coupled to ground potential through conductive transistors 127,131, and its gate at +20 volts, electrons will tunnel from the drain onto the floating gate, programming the transistor to a strong enhancement mode, wherein a positive threshold gate voltage of at least 6–7 volts is required to turn on the transistor in this mode. Since the gate of transistor 125 is grounded during interrogation, the transistor will then be nonconductive. Node 122 is pulled HIGH, and the output of inverter 115 at node 133 goes LOW. The SFE signal, the output of inverter 118, is HIGH.

Fuse Circuit Enablement

The architecture security fuse circuit is activated by addressing the security fuse row and programming the transistor 124 of cell 125 to the depletion mode (conductive when interrogated). The output of decoder circuit 145 (FIG. 5) goes LOW when the security fuse row is selected. This turns transistor 131 off, so that there is no path to ground from node 122 through transistor 131.

To program the transistor 125 to the depletion mode, node 106 is brought LOW by turning on transistor 105. This will normally be done only after the PLD has been packaged, so that pad P21 is no longer accessible. The $\overline{EDT}$ signal is LOW during the edit mode. The signal $\overline{SFE}$ is LOW until the circuit 100 has been enabled. However, $\overline{CLR}$ is LOW only during the user clear cycle, and it is otherwise HIGH. Thus, with the $\overline{CLR}$ input to gate 101 HIGH, the output of gate 101 will be driven LOW. With both inputs to NOR gate 103 LOW, the output of NOR gate 103 is driven HIGH, turning on transistor 105, and grounding the gate of transistor 125. Similarly, signal ASG is brought LOW, turning off transistor 127.

With these conditions, the potential at node 122 will rise due to the pull-up action of transistors 119, 121. Inverter 115 will flip LOW as the potential at node 122 rises, turning off transistor 117, so that node 122 rises to +20 volts. With the gate of transistor 125 grounded and the drain at +20 volts less the enhancement threshold voltage of device 123, or about 18 volts, electrons will tunnel off the floating gate to the drain, programming the transistor to the depletion mode. Now, during the normal user device mode, the transistor will conduct when its gate is grounded and when sensed by inverter 115, pulling node 122 LOW. With its input LOW, the inverter 115 output goes HIGH.

The inverter 115 output is coupled through inverter 118 to latch 140, which is adapted to latch its existing input state to its output (SFE) when EDT is HIGH, during the edit mode. When EDT is LOW, the latch is transparent. The latch prevents the SFE signal from changing in the Edit mode when the interrogation voltages are changed to their respective programming conditions.

The SFE HIGH condition prevents future regenerative erases (as described below), and enables the security fuse circuit 300. The SFE circuit 100 may not be erased, however, once it has been enabled.

Security Fuse System Operation

The security fuse system 300 operates in the following manner. The SFE enable circuit 100 is activated, providing the signal SFE at the LOW logic level. This releases node 322, since the transistor 331, gated by the signal SFE, is now nonconductive. With these conditions, the cell 324 will be programmed to the conductive state the next time the architecture row is selected, i.e., when the signal ARCH ROW representing the output of the row decoder 30 is at the HIGH logic level, and the signal MCG1 driving the gate of the floating gate transistor 325 is grounded during a programming cycle. Once the cell 324 is programmed to the conductive state (when interrogated), the state of the cell data will be latched at node 341 (the output of latch 340), the output of the NOR gate 345 (the signal $\overline{VSF}$) will be at the HIGH logic level, and the transistor 248 of the row decoder 30 depicted in FIG. 5 (driven by the signal $\overline{VSF}$) will be gated to the conductive condition. With the gate of transistor 248 driven HIGH, the signal ARCH ROW is pulled LOW, and the cells in the architecture row cannot be selected for programming again, preventing further changes to the device architecture.

Post-Assembly Regenerative SFE Erase

With the SFE circuit "erased," the PLD architecture may be configured (or reconfigured) from its existing logic configuration. It is important to ensure that the "erased" status of the SFE circuit not degenerate resulting from charge loss from the floating gate, since this would enable the security fuse circuit 300. This is accomplished by a post-assembly regenerative erase function, which occurs when all inputs to NOR gate 101 of circuit 100 are low, that is, when $\overline{SFE}$ is LOW (erased), the device is in the "clear" mode ($\overline{EDT}=\overline{CLR}=0$), and transistor 131 is turned on (i.e., the security fuse row is not selected). When these conditions are met, node 102 goes HIGH, turning off transistor 105, allowing node 106 to be pulled HIGH to +20 volts, thereby erasing the cell to its full enhancement mode floating gate potential.

The regenerative erase occurs each time the "user clear" device function is selected, provided $\overline{SFE}$ is not HIGH. The PLD is adapted to allow the user to erase all memory locations during a "bulk erase" cycle; during this cycle $\overline{EDT}$ and $\overline{CLR}$ are both low. The regenerative erase does not erase a programmed SFE circuit cell 124, since the signal $\overline{SFE}$ is HIGH in this state, and the gate 101 output will remain low. With both inputs to gate 103 low, its output is HIGH, turning on transistor 105 and grounding the gate of floating gate transistor 125. Since the gate must be elevated to the HIGH programming voltage to erase the transistor to the enhancement mode, the memory cell is not erased. Thus, the regenerative erase function only affects an erased SFE circuit cell 124.

Reduced Interrogation Voltage

Further margin against charge loss on the floating gate of the transistor 125 resulting from high temperature packaging steps is provided by reducing the read or interrogation voltage of the memory cell 124. The PLD is typically packaged with the SFE circuit cell 124 in the erased state. The manufacturer, for example, may choose to thereafter enable the SFE circuit 100. The transistor 125 of memory cell 124 of the SFE circuit 100 is read or interrogated with its gate at ground potential, instead of the +2.5 volts gate potential nominally employed to read memory cells of this type. As charge loss from the floating gate of transistor 125 occurs with the transistor in the enhancement mode, the required threshold gate voltage required to turn on the transistor is reduced. Thus, reducing the cell interrogation voltage from +2.5 volts to 0 volts provides additional margin against the high temperature induced charge loss After the PLD has been packaged and the SFE circuit 100 has been enabled, there is no way to erase the SFE circuit cell 124. The circuit logic prevents the storage transistor 125 from being erased whenever the security fuse is enabled, i.e., whenever SFE is LOW. This follows from the operation of NOR gate 101 and its inputs as discussed above. Thus, the preferred embodiment of the security fuse allows one-time programming of the protected data once the circuit has been enabled.

There has been described above a novel security circuit for selectively allowing one-time programming of protected information in a PLD. The security circuit allows selective reprogrammability of the protected data to be determined by the manufacturer of the PLD prior to shipment to the user. Moreover, those AND array cells not protected by the security system are still reprogrammable even when the security system is activated.

It is understood that the above-described embodiment is merely illustrative of the possible specific embodiments which can represent principles of the present invention. Other arrangements may be devised in accordance with these principles by those skilled in the art without departing from the scope of the invention.

What is claimed is:

1. A security circuit for selectively preventing the erasure or programming of predetermined electrically erasable memory cells in an integrated circuit programmable logic device when such programmable logic device is in an edit mode wherein selected electrically erasable cells of the programmable logic can be erased, programmed, or interrogated, comprising:

first electrically erasable means for storing first security data having first and second states;

first latching means responsive to said first security data for providing a first latching means output having first and second states, said latching means output having the same state as said first security data except during the edit mode when said first latching means output is latched to the same state of said first security data prior to the programmable logic device being in the edit mode;

first programming means responsive to first control signals and said first latching means output for electricity erasing said first electrically erasable means to initialize said first security data to said first state and for programming said first security data to said second state in a selected edit mode, said programming means being disabled from resetting said first security data to said first state after said first security data is programmed to said second state;

second electrically erasable means for storing second security data having first and second states;

second latching means responsive to said second security data for providing a second latching means output having first and second states, said latching means output having the same state as said second security data except during the edit mode when said second latching means output is latched to the same state of said second security data prior to the programmable logic device being in the edit mode;

second programming means responsive to second control signals and said first latching means output for electrically erasing said second electrically erasable means to initialize said second security data to said first state and for programming said second security data to said second state when said predetermined electrically erasable memory cells are selected in an edit mode subsequent to the edit mode in which said first security data was programmed to said second state, said programming means being disabled from resetting said second security data to said first state after said first security data is programmed to said second state; and means for disabling erasure or programming of the predetermined electrically erasable memory cells in response to the second state of said second latching means output when the programmable logic device is in an edit mode subsequent to the edit mode in which said second security data was programmed to said second state.

2. The security circuit of claim 1 wherein said first and second electrically erasable means comprise first and second floating gate transistors.

3. The security circuit of claim 1 wherein said first programming means includes means for enabling the initialization of said first security data to said first state, said initialization enabling means being disabled after the programmable logic device is packaged.

4. The security circuit of claim 3 wherein said enabling means comprises an extra wafer probe pad which is inaccessible after the programmable logic device is packaged.

5. The security circuit of claim 3 wherein said first programming means further includes gating means responsive to said first latching means output and said enabling means.

6. The security circuit of claim 1 wherein said disabling means comprises an address decoder.

7. The security circuit of claim 1 wherein said first programming means further selectively and regeneratively erases said first electrically erasable means when the programmable logic device is being programmed in the edit mode and when said first electrically erasable means is in said first state.

8. The security circuit of claim 1 further comprising means for sensing the state of said first electrically erasable means, said sensing means being adapted to provide margin against high temperature charge loss effects.

9. A security circuit for selectively preventing the erasure or programming of predetermined electrically erasable memory cells in an integrated circuit programmable logic device when such programmable logic device is in an edit mode wherein selected electrically erasable cells of the programmable logic can be erased, programmed, or interrogated, comprising:

first electrically erasable means for storing first security data having first and second states;

first programming means responsive to first control signals and said first security data for electrically erasing said first electrically erasable means to initialize said first security data to said first state and, for programming said security data to said second state in a selected edit mode, said programming means being disabled from resetting said first security data to said first state after said first security data is programmed to said second state;

second electrically erasable means for storing second security data having first and second states;

second programming means responsive to second control signals and said first security data for electrically erasing said second electrically erasable means to initialize said second security data to said first state and for programming said second security data to said second state when the predetermined electrically erasable memory cells are selected in an edit mode subsequent to the edit mode in which said first security data was programmed to said second state, said programming means being disabled from resetting said second security data to said first state after said first security data is programmed to said second state; and means for disabling erasure or programming of the predetermined electrically erasable memory cells in response to the second second state of said second security data when the programmable logic device is in an edit mode subsequent to the edit mode in which said second security was programmed to said second state.

10. The security circuit of claim 9 wherein said first and second electrically erasable means comprise first and second floating gate transistors.

11. The security circuit of claim 9 wherein said first programming means includes means for enabling the initialization of said first security data to said first state, said initialization enabling means being disabled after the programmable logic device is packaged.

12. The security circuit of claim 11 wherein said enabling means comprises an extra wafer probe pad which is inaccessible after the programmable logic device is packaged.

13. The security circuit of claim 11 wherein said first programming means further includes gating means responsive to said first security data and said enabling means.

14. The security circuit of claim 9 wherein said disabling means comprises an address decoder.

15. The security circuit of claim 9 wherein said first programming means further selectively and regeneratively erases said first electrically erasable means when the programmable logic device is being programmed in the edit mode and when said first electrically erasable means is in said first state.

16. The security circuit of claim 9 further comprising means for sensing the state of said first electrically erasable means, said sensing means being adapted to provide margin against high temperature charge loss effects.

* * * * *

UNITED STATES PATENT AND TRADEMARK OFFICE
CERTIFICATE OF CORRECTION

PATENT NO. : 4,887,239
DATED : December 12, 1989
INVENTOR(S) : John E. Turner It is certified that error appears in the above-identified patent and that said Letters Patent is hereby corrected as shown below:

On the title page, item [56]-
Under <u>References Cited</u> add:

| | | | |
|---|---|---|---|
| 4,430,709 | 2/7/84 | Schleupen | 364/200 |
| 4,295,041 | 10/13/81 | Ugon | 235/487 |
| 4,698,750 | 10/6/87 | Wilkie et al. | 364/200 |
| 4,603,381 | 7/29/86 | Guttag | 364/200 |

Column 1, lines 16 & 17, change "userprogrammed" to --user-programmed--;

Signed and Sealed this

Third Day of September, 1991

*Attest:*

HARRY F. MANBECK, JR.

*Attesting Officer*  *Commissioner of Patents and Trademarks*